(12) United States Patent
Deml

(10) Patent No.: US 7,777,532 B2
(45) Date of Patent: Aug. 17, 2010

(54) METHOD AND CIRCUIT FOR PROTECTING A MOSFET

(75) Inventor: Christoph Deml, Munich (DE)

(73) Assignee: Infineon Technologies AG, Neubiberg (DE)

( * ) Notice: Subject to any disclaimer, the term of this patent is extended or adjusted under 35 U.S.C. 154(b) by 13 days.

(21) Appl. No.: 12/182,850

(22) Filed: Jul. 30, 2008

(65) Prior Publication Data

US 2010/0026384 A1   Feb. 4, 2010

(51) Int. Cl.
*H03K 3/00* (2006.01)
(52) U.S. Cl. .................. 327/108; 327/109; 327/111; 327/112; 326/83
(58) Field of Classification Search .......... 327/108, 327/109, 110, 111, 112; 326/82, 83
See application file for complete search history.

(56) References Cited

U.S. PATENT DOCUMENTS

| | | | | |
|---|---|---|---|---|
| 4,595,966 A | * | 6/1986 | Huber et al. ............... | 361/98 |
| 4,667,121 A | * | 5/1987 | Fay et al. .................. | 327/83 |
| 4,771,357 A | * | 9/1988 | Lorincz et al. ............ | 361/87 |
| 4,896,245 A | * | 1/1990 | Qualich .................... | 361/103 |
| 5,119,265 A | * | 6/1992 | Qualich et al. ........... | 361/103 |
| 5,325,258 A | * | 6/1994 | Choi et al. ................ | 361/87 |
| 6,356,138 B1 | * | 3/2002 | Ohshima .................. | 327/434 |

\* cited by examiner

*Primary Examiner*—Kenneth B. Wells
(74) *Attorney, Agent, or Firm*—Slater & Matsil, L.L.P.

(57) ABSTRACT

The invention relates to a method and a corresponding circuit for protecting a power MOSFET from thermal overload when switching the MOSFET off and on, wherein the MOSFET is switched on again after at least a determined off-period has passed.

17 Claims, 3 Drawing Sheets

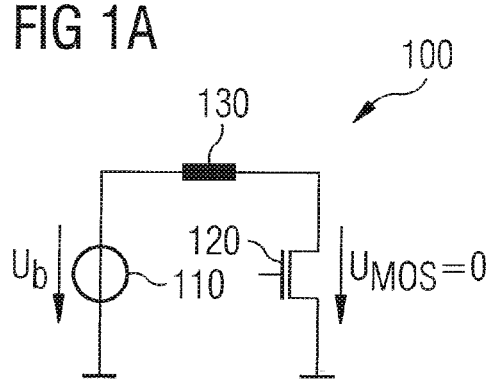
FIG 1A
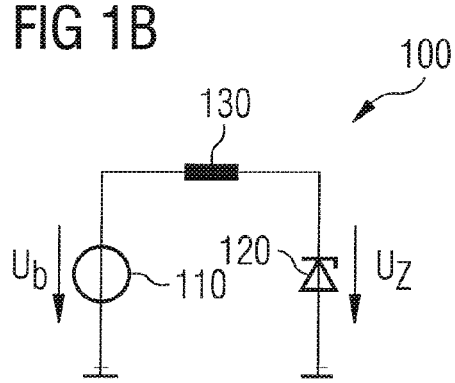
FIG 1B
FIG 2
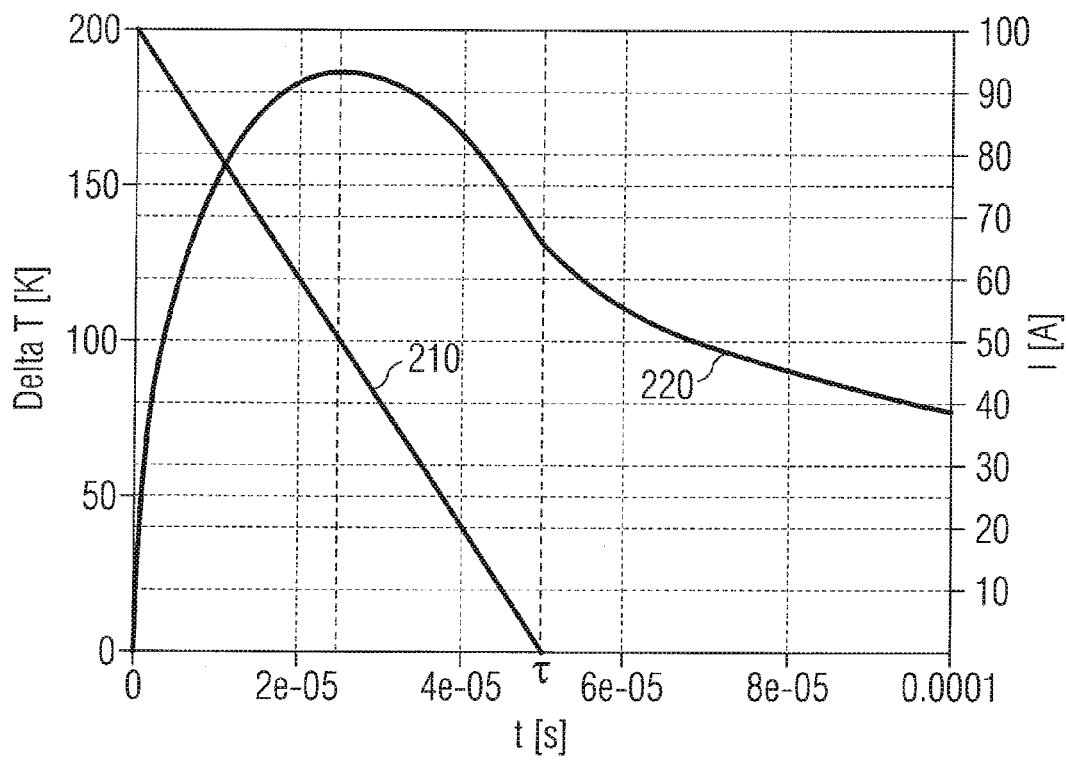

METHOD AND CIRCUIT FOR PROTECTING A MOSFET

TECHNICAL FIELD

The invention relates to the field of electrical circuits comprising transistors. In particular embodiments, the invention describes a method and corresponding circuits for protecting power MOSFETs employed as switches from overload when switching a coupled load circuit off and on.

BACKGROUND

Transistors can be employed as switches in electrical circuits. In particular, power MOSFETs are employed as switches in a load circuit for coupling a load to a source. The transistor may be either switched on, i.e., to its conducting state, thus allowing a current flow through the load circuit, or the transistor may be switched off, i.e., switched to non-conducting.

When switching the transistor on, i.e., switching the transistor to conducting, the electrical load is coupled to the voltage or current source allowing a current to flow through the circuit, i.e., through the transistor and the load. When switching a transistor off, i.e., switching the transistor from conducting to non-conducting, the transistor will disconnect the load from the source, such that the transistor will stop a current flow in the load circuit. However, if the load circuit comprises an inductor, the current flow in the load circuit will not stop immediately when switching the transistor off. An inductor included in the load circuit will discharge its stored energy, such that the current flowing in the load circuit and through the transistor decreases with time until the inductor is fully discharged.

The transistor may be designed to stand the current flow, i.e., the dimensions of the transistor are chosen such that under normal operating conditions the current will not cause any damage to the transistor.

For higher currents, a plurality of transistors can be switched in parallel, such that each of the plurality of transistors carries only a part of the total current. Although the current in this case is distributed across the plurality of parallel transistors, each of the plurality of transistors is designed for carrying only a portion of the total current. The problem of overload thus remains for each transistor.

However operating conditions may deviate from normal operations, for which the transistor has been designed, and a higher current may flow through a transistor. For example, in case of a short on the load side of the transistor, an unusually high current may flow, causing a current density in the transistor exceeding the allowed range.

A current causing a current density exceeding the allowed range may destroy the transistor by heating the semiconductor structure, such that the transistor is locked in its conducting state and cannot be switched off by applying an appropriate gate voltage. In this case the transistor is destroyed.

Hence a transistor operated as a power switch should be protected from situations heating the transistor above an allowed temperature.

In most cases where the transistor is switched off, it will be later switched to conducting in order to couple the load to the power supply again. In case the overload situation will occur again the transistor will be repeatedly switched on and off. Hence there is a need for an improved method and circuit for minimizing the duration when the transistor is switched off while at the same time preventing the transistor from being heated beyond its limit.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a and 1b depict circuit diagrams comprising a transistor as a switch and an inductive load in operation;

FIG. 2 depicts the current through a transistor and corresponding heating of the transistor;

DETAILED DESCRIPTION OF ILLUSTRATIVE EMBODIMENTS

Figure 3:
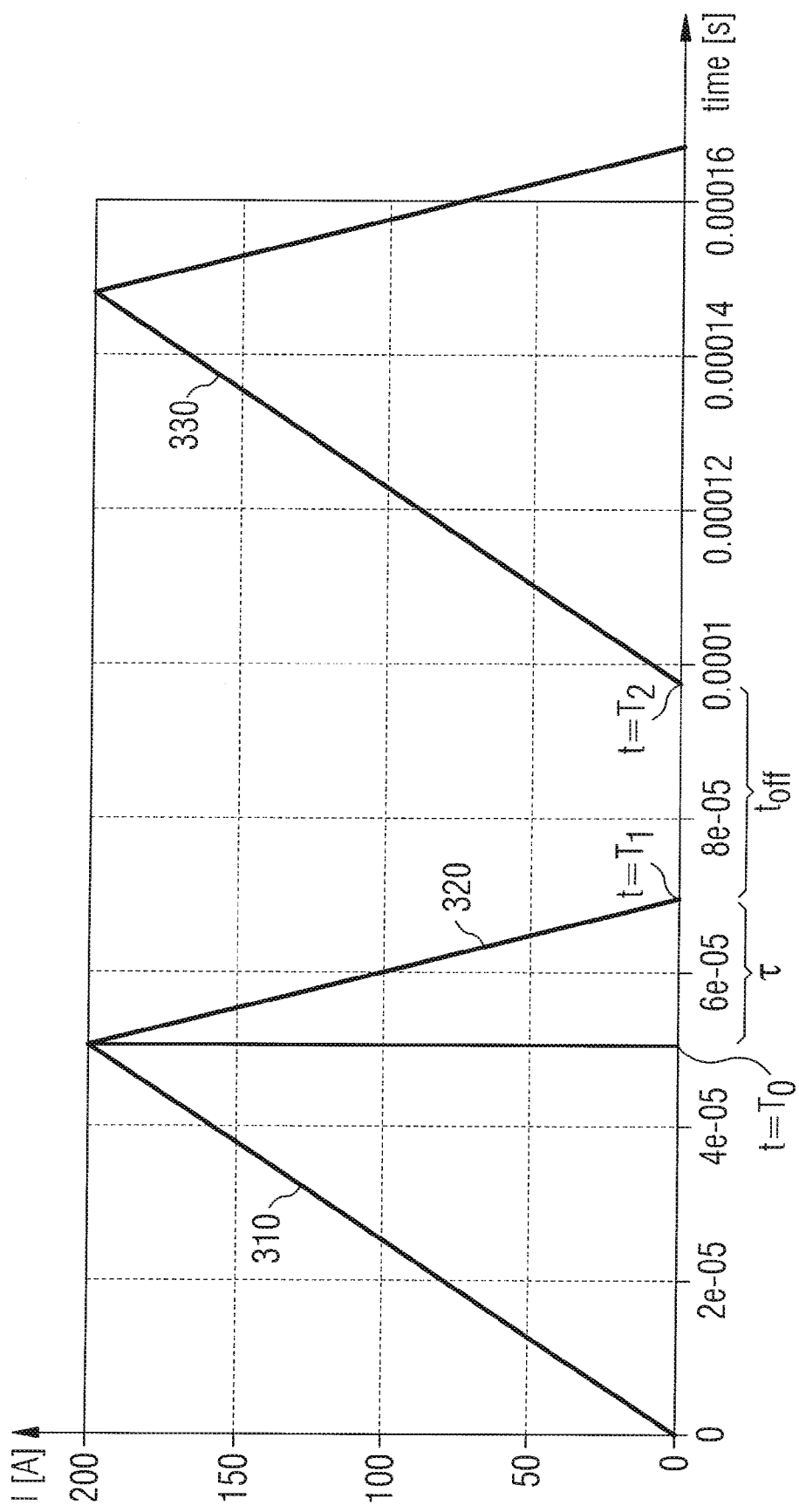
FIG. 3 depicts the temporal development of a current in a switch-on and off process.

The present invention will now be described with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In particular functional blocks may be implemented arbitrarily as long as the block provides the required function.

Although the embodiments described herein, in particular, relate to MOSFETs employed as switches, the disclosed method and circuitry generally may be applied to circuits comprising any transistor operated as a power switch.

FIGS. 1a and 1b depict a circuit 100 comprising a voltage source 110, a MOSFET 120 and an inductor 130. Voltage source 110 can be any electrical source suitable for supplying the load circuit with electrical energy. Generally, the described invention can be used with all kinds of passive loads in the load circuit. Accordingly, the load circuit may also comprise capacitors or ohmic resistors. However, it has turned out that an inductor without an ohmic resistor or any capacitor may provide for a worst case scenario as it causes the most stress on transistor 120 when switching the load circuit off.

In Fig. 1a, power MOSFET 120 is controlled to switch to conducting, i.e., in case of an N-MOSFET a high voltage is applied to its gate for switching to conducting. As the switch is assumed to be ideal, the voltage drop across MOSFET 120 is assumed to be zero, i.e., $U_{MOS}=0$. Accordingly, the voltage of source 110 solely drops across inductor 130, such that the voltage drop across inductor 130 equals the source voltage $U_b$.

The energy $E_L$ stored in the inductor is given by $E_L=\frac{1}{2} \cdot LI^2$ with L being the inductance of inductor 130 and I being the current through inductor 130.

When switching MOSFET 120 from conducting to non-conducting, inductor 130 "tries" to keep up the current flow through itself, thus causing a current flowing through the circuit and thus through MOSFET 120.

FIG. 1b depicts the voltages in circuit 100 with MOSFET 120 being switched off at a time immediately after switching off the transistor, i.e., immediately after applying a switch-off signal to its gate. MOSFET 120 in FIG. 1b accordingly is represented by its parasitic Z-diode resulting from the pn-junction within MOSFET 120. When switching MOSFET 120 off, the voltage drop across Z-diode 120 is nearly constant and varies only due to the heating of the diode, i.e., the heating of the MOSFET, resulting from the absorbed energy and the current density.

The energy stored in inductor 130 discharges into MOSFET 120, wherein the voltage in the circuit is nearly constant over time when the inductor discharges. MOSFET 120 thus absorbs the energy stored in inductor 130 and from the source, which also supplies energy during the switch-off process. The absorbed energy is dissipated into thermal energy within the MOSFET. The process of discharging inductor 130 in this way heats MOSFET 120, wherein the MOSFET is destroyed when the pn-junction within the MOSFET exceeds a temperature limit. Heating of the pn-junction in the MOSFET to a temperature exceeding the limit destroys the transistor as the semi-conducting material then may become intrinsically conductive, such that the MOSFET cannot be switched off anymore and thus becomes uncontrollable.

Accordingly, the MOSFET must be switched off such that in the subsequent switch-off process, i.e., when complex load discharges, the energy absorbed by the MOSFET does not heat the pn-junction within the MOSFET to a temperature above the limit.

FIG. 2 depicts a curve 210 illustrating the current through and a curve 220 illustrating the resulting heating of a MOSFET when switching the MOSFET off in a circuit as shown in FIG. 1. Note that in the figure the temperature scale is drawn on the left and the current scale is drawn on the right side of the coordinate system.

For calculating the curves, the cross-sectional area of the MOSFET was assumed to have an area of $A=7mm^2$, the voltage $U_b$ of the voltage source being $U_b=12V$ and the inductor having an inductance of $L=16,5\mu H$, the voltage $U_z$ across the parasitic Z-diode of the MOSFET being at around $U_z=45V$ and constant, although in reality the voltage will slightly decrease.

Current curve 210 shows that the current 210 starts from an initial value of $I_0=200 A$ at $t=0$, i.e., at the start of the switch-off process, and in this example decreases with a constant rate to zero at $t=\tau=50\mu s$. The additional heating 220 caused by the energy absorbed in the MOSFET starts from 0 Kelvin and increases fast to its peak value $\Delta T_{max}$, then decreases due to heat dissipation within the MOSFET. Note that the peak value of the heating is reached before the current 210 has reached zero.

If the MOSFET is switched on and off repeatedly due to unexpected operating conditions, then the MOSFET will cycle through a loop of being switched on and off, wherein each switch-off process may heat the MOSFET. The repeated heating of the MOSFET and in particular of the pn-junction within the MOSFET may result in a temperature destroying the MOSFET.

However, there are situations requiring an almost uninterrupted power supply. For example, in the automotive industry power MOSFETs are utilized as switches for coupling a front light to a source, i.e., for example, the battery or generator of a vehicle. Conventional front lights, i.e., light bulbs, show characteristics of inductors, such that they discharge energy when switched off. It is apparent that a front light should be provided non-stop with energy. Accordingly, when the MOSFET is switched off due to a detected overload situation, it should be switched on as soon as possible. That is, the span of time, i.e., the off-period, between switching the MOSFET off, i.e., to its non-conducting state, and switching the MOSFET on, i.e., to its conducting state, should be as short as possible, while at the same time the temperature of the MOSFET should drop in order to allow to switch it off immediately again without destroying the MOSFET. That is the off-time should be as short as possible but allow the MOSFET to cool down sufficiently.

FIG. 3 illustrates the temporal development of a current through a load circuit as depicted in FIG. 1a. With reference to the above mentioned example, voltage source 110 may be a battery and MOSFET 120 may be a power MOSFET for controlling light bulb 130, which is considered as an inductor here.

When switching the MOSFET on, a current 310 will flow in the circuit. Assuming that the MOSFET is switched off at time $t=T_0$, then the current flowing in the circuit and thus through the MOSFET will decrease until reaching an amplitude of zero at time $t=_1$, with $\tau$ denoting the span of time, i.e., the current drop time, between $t=T_0$ and $t=T_1$.

The current I through the MOSFET affects a voltage of $U_z$ dropping across the MOSFET, wherein $U_z$ is assumed constant. Hence, the energy absorbed by the MOSFET is given as:

$$E = \frac{U_z \cdot I_{t=T_0}}{2} \cdot \tau, \quad (1)$$

with $I_{t=0}$ being the current amplitude at $t=T_0$.

A drop in temperature $T_{jc}$ of the pn-junction in the MOSFET can be determined to:

$$T_{jc} = R_{th,jc} \cdot P \quad (2)$$

wherein, $R_{th,jc}$ is the thermal resistance between the pn-junction in the MOSFET and the reading point of the temperature, and wherein P is the power dissipated from the pn-junction.

Considering that the MOSFET dissipates the electrical energy of the inductance during the switch-off process, i.e., during time $t=\tau$, the average electrical power P can also be determined to:

$$P \leq \frac{E}{t_{off} + \tau} \quad (3)$$

wherein, $t_{off}$ is the time span the MOSFET is switched off and without any current, i.e. starting at $t=T_1$.

By replacing energy E in equation (3) with (1) and then average power P in (2) with amended equation (3) we find:

$$T_{jc} = R_{th,jc} \cdot \frac{\frac{U_z \cdot I_{t=T_0}}{2} \cdot \tau}{t_{off} + \tau}, \quad (4)$$

which can be transformed to, $$t_{off} = \left(\frac{R_{th,jc}}{T_{jc}} \cdot \frac{U_z I_{t=T_0}}{2} - 1\right) \cdot \tau \quad (5)$$

Equation (5) thus specifies a time span $t_{off}$ needed for cooling down the pn-junction by a temperature $T_{jc}$.

Considering now that the pn-junction of the MOSFET should have a temperature below an allowable maximum junction temperature of $T_{jc,max\ allowed}$ and that the actual temperature $T_{case}$ of the transistor, e.g., of the casing of the pn-junction, can be measured, then we can set:

$$T_{jc} < T_{jc,max\ allowed} - T_{case} \quad (6)$$

By replacing $T_{jc}$ in equation (5) with (6) we get $$t_{off} = \left( \frac{R_{th,jc}}{T_{jc,maxallowed} - T_{case}} \cdot \frac{U_Z I_{t=T_0}}{2} - 1 \right) \cdot \tau \qquad (7)$$

Equation (7) thus specifies the time span necessary for cooling down the pn-junction from a measured casing temperature to a temperature well below the maximum allowed temperature, which allows another switch-off process heating the MOSFET without destroying it.

The value of $R_{th,jc}$ can be measured or calculated and may be set as a constant in equation (7). Also, voltage $U_z$ across the MOSFET during the switch-off process and the maximum allowable pn-junction temperature are known, such that these can be set constant also. Time span $t_{off}$ for cooling down the pn-junction in the MOSFET to a temperature allowing another switch-off process thus can be calculated by measuring the temperature of the MOSFET casing and measuring current I through the MOSFET, wherein the measured values comprise the current amplitude at $t=T_0$ and at $t=T_0+\tau=T_1$, such that with the help of a timer current drop time $\tau$ can be determined from the measured values.

That is, the MOSFET can be switched on again, i.e., conducting, after an off-period of:

$$t_{\tau,off} = \frac{R_{th,jc}}{T_{jc,maxallowed} - T_{case}} \cdot \frac{U_Z I_{t=T_0}}{2} \cdot \tau, \qquad (8)$$

wherein, $t_{\tau,off}$ determines the span of time from switching the transistor off to switching the transistor on again. That is, off-period $t_{\tau,off}$ comprises current drop time $\tau$ and cooling off time $t_{off}$.

A method for operating an integrated circuit comprising a transistor accordingly comprises the method steps of switching the transistor to its non-conducting state, determining an off-period depending on the amplitude of a current through the transistor and the temperature of the transistor when switching the transistor to its non-conducting state and on a current drop time, and switching the transistor to its conducting state after at least the off-period has passed.

Proceeding from the determined values, time span $t_{off}$ and also off-period $t_{\tau,off}$ can be determined according to equation (7) or (8) respectively. The transistor may then be switched on again after the calculated/determined off-period has passed. That is, the MOSFET may be switched on again at $t=T_2$ thus allowing a current flow 330 in the load circuit. In case current 330 exceeds a threshold value be determined according to, i.e., 200A in this example, then the MOSFET is switched off again. Note that the switch-off criteria may be chosen arbitrarily, for example, such that the threshold for switching off may vary in successive switch-off operations. In any case, as the current amplitude and the temperature of the MOSFET at switch-off time and current drop time $\tau$ are considered, the off-period is calculated for each switch-off process individually. Accordingly, the duration of the off-period may vary for successive switch-off operations.

Note that current drop time $\tau$ can be determined, for example, by measuring the current through the transistor when switching it off, i.e., when applying a control voltage to its gate to switch it off, and then successively measuring the current amplitude until it has reached a zero level, such that the current drop time $\tau$ between these two current amplitudes can be determined.

Figure 4:
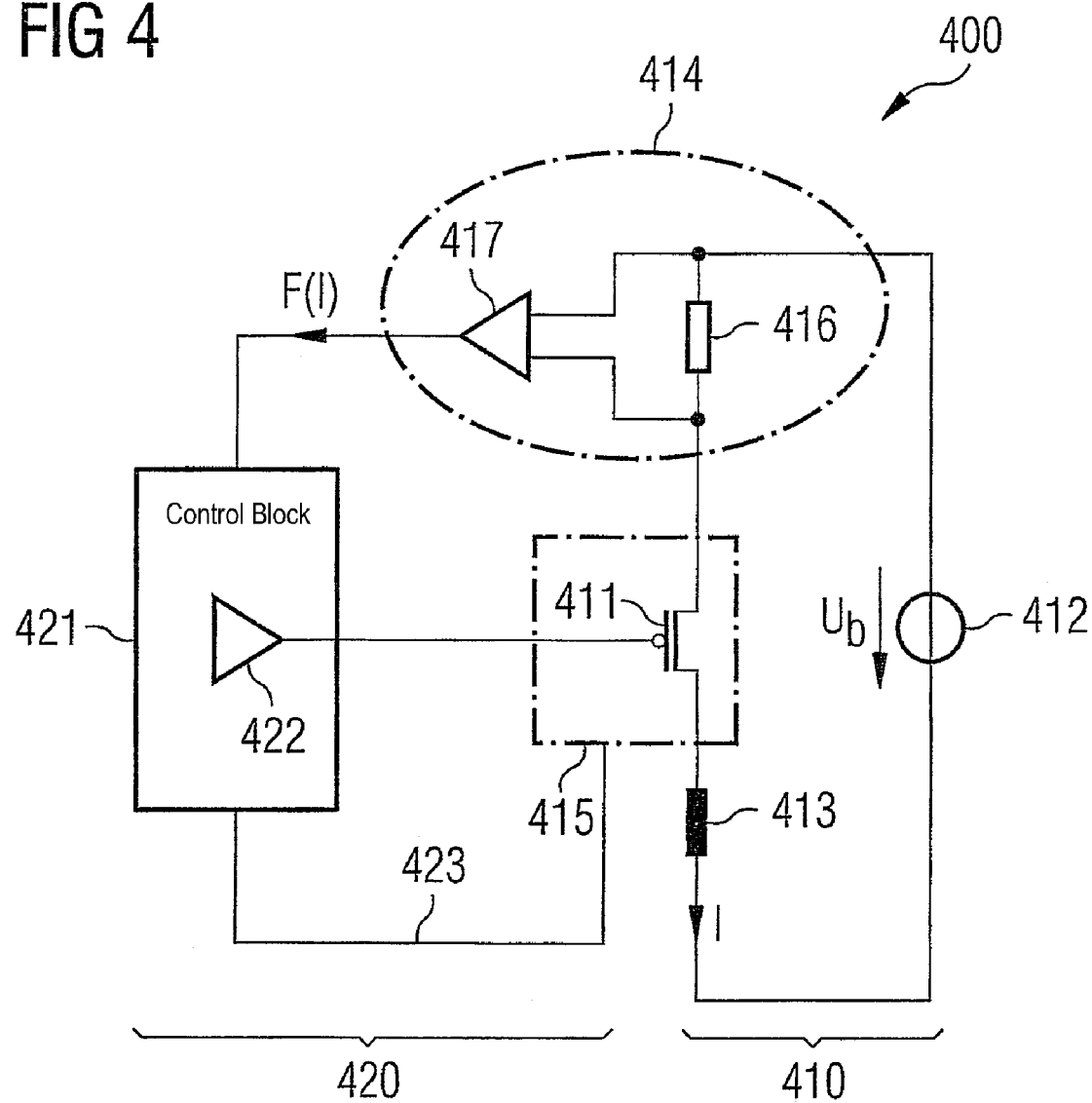
FIG. 4 depicts a schematic circuit of an embodiment.

FIG. 4 depicts a schematic circuit 400 adapted and configured for executing the above mentioned method, wherein the circuit comprises a load circuit section 410 and control circuit section 420.

Load circuit section 410 at least comprises the MOSFET 411, which is the MOSFET to protect, source 412, a complex load 413 and a circuit 414 for providing a signal F(T) reflecting the amplitude of current I through the MOSFET. MOSFET 411 may be of N- or P-type and serves as a switch for coupling source 412 to complex load 413, wherein the MOSFET is controlled by control circuit section 420. MOSFET 411 is comprised in casing 415. The casing may be any conventional casing comprising at least the MOSFET to protect and a temperature sensor for sensing the casing temperature.

Note that the temperature sensor may be any device or sub-circuit suitable for producing an electrical signal reflecting the temperature at the reading point, i.e., the point where the sensor is located. The reading point may be located at any location allowing measurement of the temperature of the pn-junction in the MOSFET. That is, the reading point preferably is located in the heat dissipation path, i.e., between the pn-junction being the heat source and the heat sink, which may be, for example, a cooling element. In this way, the sensed temperature in combination with the known thermal resistance between the reading point and the pn-junction allows accurate deduction of the pn-junction temperature.

Voltage source 412 may be a battery or generator providing a voltage of $U_b$. Load 413 may be any complex load, in particular a load having characteristics of an inductor. Circuit 414 may be any suitable means for producing an output signal F(I) reflecting the amplitude of the current through the MOSFET to protect 411. The circuit, for example, can be implemented by an ohmic resistor 416, which forms a simple current-to-voltage converter and which is coupled to an operational amplifier 417, wherein the operational amplifier takes the voltage drop across resistor 416 as input and accordingly outputs a voltage F(I) reflecting the amplitude of current I.

Note that in this embodiment the temperature sensor senses the temperature of the casing which comprises the MOSFET in order to provide a signal to control circuit section 420 reflecting the temperature of the pn-junction of the MOSFET. By sensing the temperature of the casing, the temperature signal is generated at a point physically coupled to the MOSFET, and thus to its pn-junction, via thermal resistor $R_{th,jc}$. The temperature signal in this way does not directly indicate the temperature of the pn-junction within the MOSFET. However, as the thermal resistance between the pn-junction and the reading point of the temperature sensor is known, the produced signal can be used to reflect the temperature of the pn-junction. Accordingly, the temperature sensor may sense the temperature at any point thermally coupled to the pn-junction if the thermal resistance between the reading point and the pn-junction is known, in particular in the close vicinity of the MOSFET. That is, the temperature to be used in the above given equations may be sensed at any reading point allowing deduction of the pn-junction temperature. It is apparent to a person skilled in the art that depending on the individual structure of an integrated circuit comprising the MOSFET, the reading point for generating the temperature signal may be somewhere else within the integrated circuit or even outside of the circuit, for example, at a heat sink coupled to the MOSFET.

In one example, circuit 400 may be implemented in the automotive branch, i.e., for example, in a vehicle. Accordingly, source 412 may be a battery or a generator of the vehicle and load 413 may be a bulb of a front light, the load thus having characteristics of an inductor.

Control circuit section 420 at least comprises control block 421, which in turn comprises and controls a MOSFET driver sub-circuit 422, a timer sub-circuit and a comparator sub-circuit. The comparator sub-circuit takes signal F(I) as input to compare that to a zero signal, for example, common ground, in order to provide a signal indicating that load current I has dropped to zero. Span of time τ can be determined, for example, by starting the timer sub-circuit at time $t=T_0$ and stopping the timer at $t=T_1$, i.e., when the comparator sub-circuit indicates that load current I has dropped to zero amplitude. Current drop time τ can be determined accordingly as period between $t=T_0$ and $t=T_1$.

MOSFET driver 422, which is coupled to the gate of MOSFET 411, outputs a signal suitable for controlling the MOSFET. That is, driver 422 provides a signal to the gate of MOSFET 411, which at least may prevent the MOSFET 411 from being switched on, such that the driver ensures that MOSFET 411 is switched off for at least a time of $\tau + t_{off}$ to allow its pn-junction to cool down.

The operation control block 421 receives signal F(I) and the temperature of the casing comprising MOSFET 411 via connection 423. In case the MOSFET is switched off, i.e., to its non-conducting state, then control block 421 receives the amplitude of current I, i.e., signal F(I) reflects the amplitude of current I, and determines current drop time τ. Based on the amplitude of current I, the actual casing temperature sensed and current drop time τ, the control block determines span of time $t_{off}$ as defined in above given equation (8). In case that the MOSFET shall be switched on again, then it will be switched on after at least an off-period of $t=\tau + t_{off}$ has passed since switching the MOSFET off.

Particularly in situations when MOSFET 411 is switched off due to an overload condition, i.e., if the load current exceeded a threshold, the method of switching the MOSFET on after at least the calculated time span has passed protects the MOSFET from overheating. In cases where the overload condition has not been resolved, the MOSFET will be switched off again soon after being switched on, thus heating the pn-junction again. However, as the MOSFET cools down to a temperature allowing another switch-off process, it will not be destroyed. Scenarios affecting an infinite loop of switching a MOSFET on and off repeatedly, for example, may be caused by short in a load circuit.

In contrast to unusual situations there can be situations of normal operation wherein the MOSFET is switched off and on repeatedly. For example, when switching a light bulb on for the first time, i.e., the light bulb is cold, then the inrush current may exceed a limit thus causing a control circuit to switch the power MOSFET off. However, the MOSFET will be switched on again as soon as possible in order to switch the light bulb on. If the current inrush again exceeds the threshold, then the MOSFET will be switched off again. In this way there may be more than one switch-on and switch-off process. However, the inrush current may decrease as the light bulb will heat up from previous switch-on processes, such that the loop of switching the MOSFET on and off will come to an end. In this case time τ may vary as the heated light bulb now shows different characteristics. Accordingly, calculated span in time $t_{off}$ may vary.

In this way, the proposed method and circuit allow the operation of the MOSFET at its thermal borderline while at the same time keeping the time span between switching the load circuit off and on as short as possible.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiments disclosed.

What is claimed is:

1. A method for operating an integrated circuit comprising a transistor, the method comprising:
   switching the transistor to its non-conducting state;
   determining an off-period depending on an amplitude of a current through the transistor and a temperature of the transistor when switching the transistor to its non-conducting state and on a current drop time; and
   switching the transistor to its conducting state after at least the off-period has passed.

2. The method of claim 1, wherein the amplitude of the current through the transistor is sensed successively and the current drop time is determined as a span of time between switching the transistor to its non-conducting state and the point in time when the current has dropped to zero.

3. The method of claim 1, wherein the temperature of the transistor is determined by sensing a temperature at a reading point physically coupled to the transistor.

4. The method of claim 3, wherein a thermal resistance of the physical coupling is known.

5. The method of claim 3, wherein the temperature is sensed between a pn-junction of the transistor and a heat sink.

6. The method of claim 1, wherein the transistor is a MOSFET.

7. The method of claim 6, wherein the off-period is calculated as $$t_{off} = \left( \frac{R_{th,jc}}{T_{jc,maxallowed} - T_{trans}} \cdot \frac{U_Z I_{t=T_0}}{2} - 1 \right) \cdot \tau,$$

wherein $R_{th,jc}$ is a thermal resistance of a pn-junction of the transistor, $U_z$ is a voltage across a parasitic diode of the transistor, $I_{t=T_0}$ is a current when the transistor is switched to its non-conducting state, $T_{jc,max\ allowed}$ is a maximum allowable junction temperature and $T_{trans}$ is the temperature of the transistor.

8. An integrated circuit comprising a transistor, the circuit comprising:
   means for switching the transistor to its non-conducting state;
   means for determining an off-period depending on an amplitude of a current through the transistor and a temperature of the transistor when switching the transistor to its non-conducting state and on a current drop time; and
   means for switching the transistor to its conducting state after at least the off-period has passed.

9. The integrated circuit of claim 8, further comprising a timer sub-circuit for determining the current drop time.

10. The integrated circuit of claim 8, further comprising a temperature sensor for determining the temperature at a reading point physically coupled to the transistor.

11. The integrated circuit of claim 10, wherein a thermal resistance of the physical coupling is known.

12. The integrated circuit of claim 10, wherein the reading point is located at a casing of the transistor.

13. The integrated circuit of claim 10, wherein the reading point is located between a pn-junction of the transistor and a heat sink.

14. The integrated circuit of claim 8, further comprising a current-to-voltage converter for generating a signal reflecting the amplitude of the current through the transistor.

15. The integrated circuit of claim 8, wherein the transistor is a MOSFET.

16. The integrated circuit of claim 15, wherein the off-period is calculated as $$t_{off} = \left( \frac{R_{th,jc}}{T_{jc,maxallowed} - T_{trans}} \cdot \frac{U_Z I_{t=T_0}}{2} - 1 \right) \cdot \tau,$$

wherein $R_{th,jc}$ is a thermal resistance of a pn-junction of the transistor, $U_z$ is a voltage across a parasitic diode of the transistor, $I_{t=T_0}$ is a current when the transistor is switched to its non-conducting state, $T_{jc,max\ allowed}$ is a maximum allowable junction temperature and $T_{trans}$ is the temperature of the transistor.

17. A circuit comprising:

a transistor; and a control circuit adapted to switch the transistor to conducting state after an off-period has passed, the off-period depending on a current through the transistor, a temperature of the transistor, and a current drop time.

* * * * *